(12) United States Patent
Beaudin et al.

(10) Patent No.: US 6,710,650 B1
(45) Date of Patent: Mar. 23, 2004

(54) AMPLIFIER SWITCHING

(75) Inventors: Steve A. Beaudin, Ottawa (CA);
Somsack Sychaleun, Kanata (CA);
Mark N. Willetts, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/259,406

(22) Filed: Sep. 30, 2002

(51) Int. Cl.$^7$ ................................................. H03F 3/68
(52) U.S. Cl. ..................... 330/124 R; 330/295; 455/126
(58) Field of Search ..................... 330/124 R, 295, 330/84, 9; 455/126

(56) References Cited

U.S. PATENT DOCUMENTS 4,490,684 A * 12/1984 Epsom et al. ............... 330/149
4,656,434 A * 4/1987 Selin ............................ 330/84
5,101,171 A * 3/1992 Redmond ............... 330/124 R

* cited by examiner

Primary Examiner—Henry Choe

(57) ABSTRACT

A low noise amplifier (LNA) in a LNA arrangement is selectively bypassed, without detracting from the performance of the LNA arrangement when it is not bypassed, by selecting components of an input signal which are reflected at the input of the LNA. These reflected signal components can be increased, when the LNA is bypassed, by interrupting a supply voltage to the LNA and/or shunting the input of the LNA to ground. The arrangement can be a balanced LNA arrangement, using two LNAs and two quadrature couplers, or it can be an unbalanced LNA arrangement.

26 Claims, 2 Drawing Sheets

AMPLIFIER SWITCHING

This invention relates to amplifier switching, for example for switching of low noise amplifiers in receive paths of wireless communications systems.

BACKGROUND

It is well known in communications systems to use a single antenna for both transmitting and receiving signals, a duplexer being provided to couple an output of a transmit power amplifier to the antenna and to couple the antenna to a receive signal path, while isolating the receive path from the output of the transmit power amplifier.

For example, in a base station of a cellular wireless communications system the duplexer may comprise cavity filters for filtering separate transmit and receive signal bands. The receive path includes a receive path filter of the duplexer and a low noise amplifier (LNA) for amplifying the receive path signal. These units are required to provide low insertion lose (high return loss) and good noise figure, these being significant parameters for operation of the system, and the LNA is required to have good linearity. For example, the receive path filter of the duplexer has a high cost to achieve a desirably low insertion loss of the order of 0.4 dB.

In different arrangements of such a system, the duplexer may or may not itself include a LNA. If it does not, then the LNA is provided subsequently in the receive path. However, if the duplexer itself includes a LNA (for example the duplexer may be provided at the antenna so that amplification of the receive path signal is desirable before it is communicated over a relatively long signal path, or a tower-mounted LNA may be equivalently provided), then it is desirable for the gain provided by such a subsequent go to be reduced or eliminated, in order to avoid non-linearity of this subsequent LNA as a result of the relatively high receive signal level which it receives from the duplexer LNA. Also, and for similar reasons, it may be desirable to provide gain switching of one or more LNAs which may be cascaded in the receive signal path, or generally to extend the dynamic gain range of one or more LNAs.

It is therefore desirable to provide switching, for example to bypass the subsequent LNA when its amplification is not required. However, introducing a switch (for example, a MESFET switch) into the receive signal path, selectively to bypass the receive signal around the LNA, increases the noise figure by, for example, about 0.5 dB. While this in not a problem when the receive path signal has already been amplified, it represents a significant increase to the noise figure of the LNA, typically about 0.7 dB, for a receive path signal which has not been previously amplified.

In addition, in a balanced LNA arrangement which is desirable to provide high return loss and hence low loading of the duplexer receive path filter, using only a single switch in the receive signal path results in the return lose of the overall LNA arrangement being reduced significantly to that of the switch; for example it may be reduced from better than 20 dB to only 14 dB for the switch.

A switched bypass can alternatively be provided around only a second gain stage of such a subsequent LNA having first and second gain stages. Whilst this substantially avoids the noise figure increase discussed above, it does not overcome the-potential for consequent non-linearity of the first gain stage of the LNA. Similarly, AGC (automatic gain control) arrangements are not effective to provide a desirable amount of receive path gain for both low noise figure and linear operation of the LNA arrangement.

Accordingly, there is a need to provide an improved arrangement for amplifier switching.

SUMMARY OF THE INVENTION

According to one aspect of this invention there is provided an amplifier arrangement comprising: an amplifier having an input and an output; a coupler having at least a first port for an input signal, a second port coupled to the input of the amplifier for supplying the input signal thereto, and a third port for a component of the input signal reflected back to the second port from the input of the amplifier; a switch for coupling the third port to a load in a first state of the switch and to a bypass path in a second state of the switch; and an output of the amplifier arrangement derived from the output of the amplifier in the first state of the switch and from the bypass path in the second state of the switch.

The arrangement preferably includes a switch for interrupting a supply voltage of the amplifier, and/or a switch for shunting the input of the amplifier to ground, in said second state of the first switch, to increase mismatch and hence signal reflection at the input of the amplifier.

The arrangement can include a switch for coupling the output of the amplifier arrangement to the output of the amplifier in said first state of the first switch and to the bypass path in said second state of the first switch, or it can include a signal combiner for coupling the output of the amplifier and the bypass path to the output of the amplifier arrangement.

The arrangement is desirably a balanced amplifier arrangement which further comprises a second amplifier having an input and an output, the input of the second amplifier being coupled to a fourth port of the first coupler; and a second coupler for coupling the outputs of the amplifiers to the output of the amplifier arrangement.

According to another aspect, the invention provides a balanced amplifier arrangement comprising: two amplifiers each having an input and an output; a first coupler having a first port for an input signal, second and third ports coupled to the inputs of the amplifiers, and a fourth port, the coupler being such that an input signal supplied to the first port is coupled to the second port and to the third port with a relative phase difference of 90°, and components of the input signal reflected back to the first coupler from the inputs of the amplifiers cancel at the first port and add at the fourth port of the coupler; a second coupler for combining signals at the outputs of the amplifiers in phase with one another; a switch for coupling the fourth port of the first coupler to a load in a first state of the switch and to a bypass path in a second state of the switch; and an output of the amplifier arrangement derived from the combined outputs of the amplifiers in the first state of the switch and from the bypass path in the second state of the switch.

This arrangement preferably includes a switch for interrupting a supply voltage of the amplifiers, and/or two switches for shunting the inputs of the amplifiers to ground, in said second state of the first switch, to increase mismatch and hence signal reflection at the inputs of the amplifiers.

The arrangement can include a switch for coupling the combined outputs of the amplifiers to the output of the amplifier arrangement in said first state of the first switch and for coupling the bypass path to the output of the amplifier arrangement in said second state of the first switch, or it can include a signal combiner for coupling the combined outputs of the amplifies and the bypass path to the output of the amplifier arrangement.

In one form of the balanced amplifier arrangement, the second coupler comprises a phase quadrature coupler having two ports coupled to the outputs of the amplifiers, a third port coupled to the output of the amplifier arrangement, and a fourth port, the arrangement further comprising a further switch for coupling the fourth port of the second coupler to a load in said first state of the first switch and to the bypass path in said second state of the first switch.

The invention also provides a duplexer arrangement for a communications system, the duplexer arrangement comprising an amplifier arrangement or a balanced amplifier arrangement as recited above, a transmit path for coupling a signal from an output of a transmitter to an antenna, and a receive path including a receive filter for coupling a received signal from the antenna to said first port of the (first) coupler of the amplifier arrangement as said input signal.

The invention further provides a method of selectively bypassing an amplifier in an amplifier arrangement, comprising the steps of: supplying a signal to an input of the amplifier; when the amplifier is not bypassed, dissipating in a load components of the signal which are reflected at the input of the amplifier; and selecting components of the signal which are reflected at the input of the amplifier to bypass the amplifier.

Preferably the method includes the step of increasing signal reflection at the input of the amplifier when said components are selected to bypass the amplifier. The step of increasing signal reflection at the input of the amplifier conveniently comprises interrupting a supply voltage to the amplifier and/or shunting the input of the amplifier to ground.

BRIEF DESCRIPTION OF THE DRAWINGS

The invention will be further understood from the following description by way of example with reference to the accompanying drawings, in which similar references are used in different figures to denote similar components and in which.

DETAILED DESCRIPTION

Figure 1:
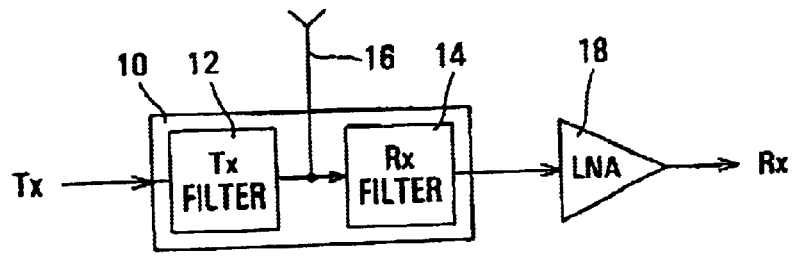
FIG. 1 schematically illustrates a known duplexer arrangement of a communications system.

Referring to FIG. 1, a known duplexer arrangement of a communications system is illustrated, comprising a duplexer 10 including a transmit (Tx) filter 12 and a receive (Rx) filter 14, connected to a single transmit/receive antenna 16, and a LNA (low noise amplifier) 18. A transmit signal from a power amplifier (not shown) of a transmitter is supplied via the TX filter 12 of the duplexer 10 to the antenna 16. A signal received by the antenna 16 is supplied via the Rx filter 14 of the duplexer to the LNA 18, which supplies an amplified receive signal on a receive path to a receiver (not shown). As is well known in such an arrangement, the transmit and receive filters 12 and 14 have different pass bands so that the powerful transmit signals are not supplied to the LNA 18.

Such an arrangement is typically desired to provide a low insertion loss (high return loss) for the LNA 18 to avoid loading the Rx filter 14, good noise figure, and good linearity of the LNA. To this end, it is known to provide the low noise amplification in a balanced LNA arrangement for example as illustrated in FIG. 2.

Figure 2:
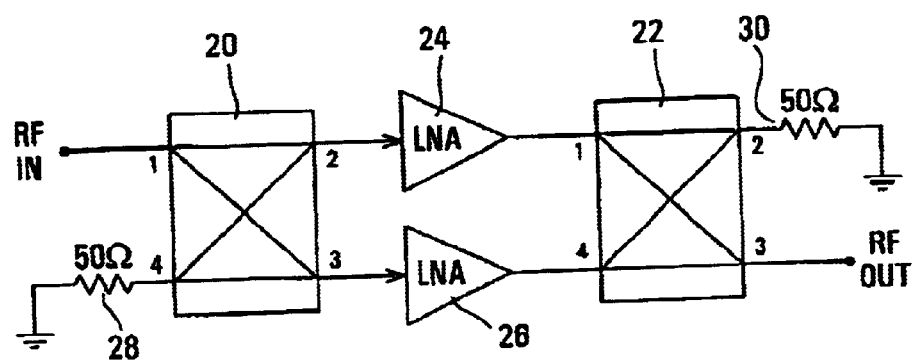
FIG. 2 schematically illustrates a known balanced LNA arrangement.

The balanced LNA arrangement of FIG. 2 comprises two 90° quadrature couplers 20 and 22, two LNAs 24 and 26, two terminating impedances or loads 28 and 30 each represented by a 50Ω resistor, and RF (radio frequency) input (IN) and output (OUT) terminals which serve respectively to receive the receive path signal from the Rx filter 14 and to supply the amplified receive path signal on the ongoing receive path. Each of the quadrature couplers 20 and 22 has four ports, labelled 1 to 4.

In the balanced LNA arrangement of FIG. 2, an RF input signal is supplied to port 1 of the coupler 20, from where it is conducted with zero phase change to the port 2 and hence to the LNA 24, and with 90° phase change to port 3 and hence to the LNA 26. The LNAs 24 and 26 amplify the received signals in a balanced manner, and supply the amplified signals to ports 1 and 4, respectively, of the coupler 22. The signal at the port 1 of the coupler 22 is conducted with a 90° phase change to the port 3 of the coupler 22, and the signal at the port 4 is coupled with zero phase change to this port 3, so that the amplified signals are combined in phase with one another at port 3 of the coupler 22 and hence at the RF output.

It can be appreciated that any signal component from the RF input port reflected at the input of the LNA amplifier 24 is subject to zero phase change in returning to port 1 of the coupler 20 via the port 2, whereas any signal component reflected at the input of the LNA amplifier 26 is subject to a total of 180° phase change in returning to port 1 of the coupler 20 via the port 3, so that such reflected signal components are of opposite phase and cancel at the RF input. Consequently, the balanced LNA arrangement provides low insertion lose despite any mismatching that may be desirable at the inputs of the LNA amplifiers 24 and 26 to achieve a desirably good noise figure.

Conversely, it can be seen that input signal components reflected to the port 4 of the coupler 20 from the inputs of the LNAs 24 and 26 undergo equal phase changes of 90°, so chat these reflected signal components add at this port 4 and are dissipated in the load 28 which is matched to the coupler 20. Similar considerations apply at the output of the balanced LNA arrangement, where unwanted signal components are dissipated in the matched load 30.

As discussed in the background of the invention above, different configurations of the receive path may include either only one LNA (or balanced LNA arrangement) or at least one other LNA (or balanced LNA arrangement), provided earlier in the receive path. In the latter case, it is desirable to provide switching to bypass the one LNA when its amplification is not required. However, in known arrangements such switching would adversely increase the noise figure of the arrangement when only the one LNA (or balanced LNA arrangement) is present.

It can also be appreciated that, to provide switching for the balanced LNA arrangement of FIG. 2, placing a single switch in the receive signal path before the balanced LNA arrangement, i.e. at the RF input terminal, to bypass the receive path signal around the LNA arrangement, results in the return loss of the overall LNA arrangement being determined by the switch, and hence being of the order of only 14 dB, rather than being determined by the balanced LNA arrangement as described above, and being 20 dB or better.

Figure 3:
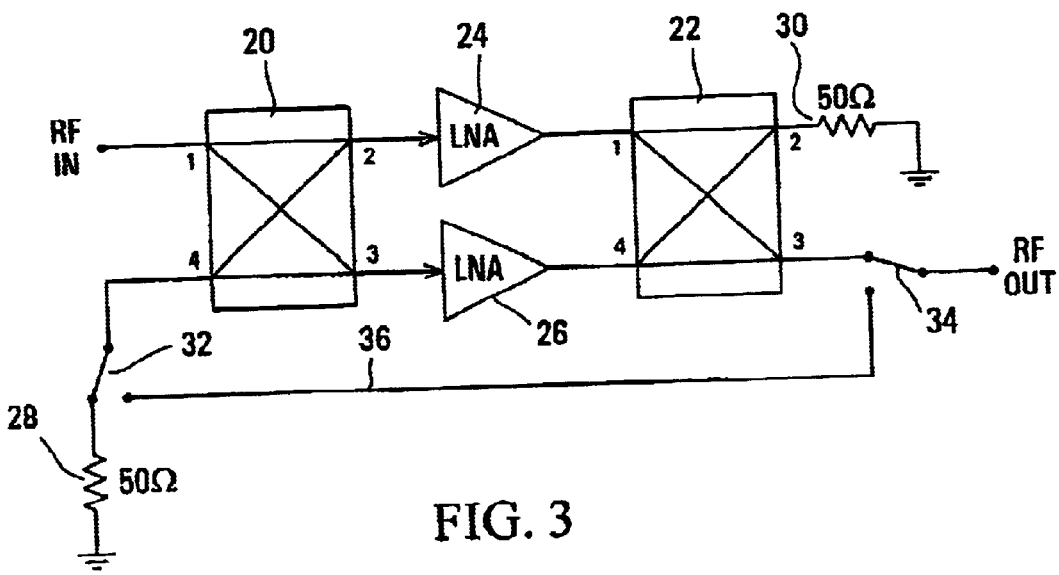
FIG. 3 schematically illustrates a balanced LNA arrangement in accordance with an embodiment of this invention.

FIG. 3 illustrates a balanced LNA arrangement in accordance with an embodiment of this invention, the arrangement using the same components 20 to 30 as the arrangement of FIG. 2, connected in the same manner as in FIG. 2 except as described below. The arrangement of FIG. 3 also includes two two-way switches 32 and 34.

As shown in FIG. 3, the switch 32 has its pole connected to the port 4 of the coupler 20 and is arranged to connect this port selectively to either the load 28 or to a bypass path 36. The switch 34, which is conveniently operated in synchronism with the switch 32, has its pole connected to the RF output and is arranged to connect this RF output selectively to either the port 3 of the coupler 22 or the bypass path 36.

Thus in one position of the switches 32 and 34, as illustrated in FIG. 3, these switches provide exactly the same connections as in the arrangement of FIG. 2, and the bypass path 36 is unconnected. In the other position of these switches 32 and 34 the bypass path 36 connects the RF output to port 4 of the coupler 20. Consequently, signal components from the RF input, connected to port 1 of the coupler 20, which are reflected at the inputs of the LNAs 24 and 26 are coupled via the switches 32 and 34 and the bypass path 36 to the RF output, instead of being dissipated in the load 28.

It can be appreciated that, in the switch position shown in FIG. 3, the switch 32 is not connected to the RF input signal path, so that it does not detract from the performance of the balanced LNA arrangement. Furthermore, the switch 34 is only present at the RF output signal path after the LNAs 24 and 26, so that it also does not detract from the performance of the arrangement.

Figure 4:
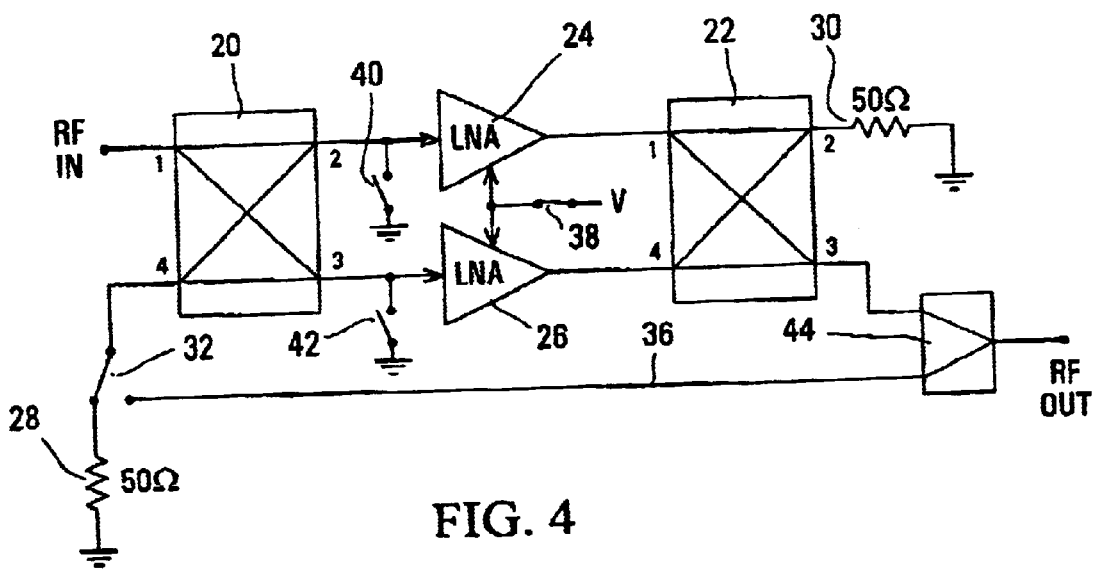
FIG. 4 schematically illustrates a balanced LNA arrangement in accordance with another embodiment of this invention.

In the arrangement of FIG. 3, the level of the signal conducted via the bypass path 36 in the bypass position of the switches 32 and 34 is dependent upon signal reflection at the inputs of the LNAs 24 and 26, and hence upon a degree of mismatch at these inputs. It may be desirable to increase this mismatch in this bypass condition. FIG. 4 illustrates a balanced LNA arrangement in accordance with another embodiment of this invention in which this is done in either or both of two different ways.

The balanced LNA arrangement illustrated in FIG. 4 is similar to that of FIG. 3 except for the addition of switches 38, 40, and 42 as described below, and replacement of the switch 34 by a signal combiner 44. In FIG. 4, all of the switches are illustrated in a position in which the LNAs 24 and 26 are effective to amplify the RF input signal as described above; none of the switches is interposed in the signal path, so that the switches do not detract from the performance of the balanced LNA arrangement. In this state of the switches, the combiner 44 supplies the signal from port 4 of the coupler 22 to the RF output, there being no signal component on the bypass path 36.

The switch 38 is illustrated as being connected in a supply path for a voltage V to the LNAs 24 and 26; in the event that the LNAs 24 and 26 are supplied with two or more supply voltages, any one or more of them can be similarly switched. The switch 38 can be opened in the bypass position of the switch 32, the LNAs 24 and 26 thereby being powered down so that no signal is supplied to the coupler 22. Consequently, in this switch position the combiner 44 supplies only the signal from the bypass path 36 to the RF output. Furthermore, the powering down of the LNAs 24 and 26 increases a signal mismatch at the inputs of the LNAs, whereby a greater signal component magnitude is reflected there and appears on the bypass path 36 and hence at the RF output. Phase cancellation of signal components reflected to the RF input continues to occur, so that the return loss of the balanced LNA arrangement is not impaired.

In addition, or instead, the switches 40 and 42 are provided, each connected between an input of a respective one of the LNAs 24 and 26 and ground. In the state of the switches shown in FIG. 4, the switches 40 and 42 are open as shown, and have no effect. In the bypass position of the switch 32, the switches 40 and 42 are closed to connect the inputs of the LNAs 24 and 26 to ground. Consequently, again, no signal is supplied via the LNAs and the coupler 22 to the combiner 44, and a mismatch at the inputs of the LNAs is increased whereby a greater signal component magnitude is reflected there and appears on the bypass path 36 and hence at the RF output. Phase cancellation of signal components reflected to the RF input again continues to occur, so that the return loss of the balanced LNA arrangement again is not impaired.

Figure 5:
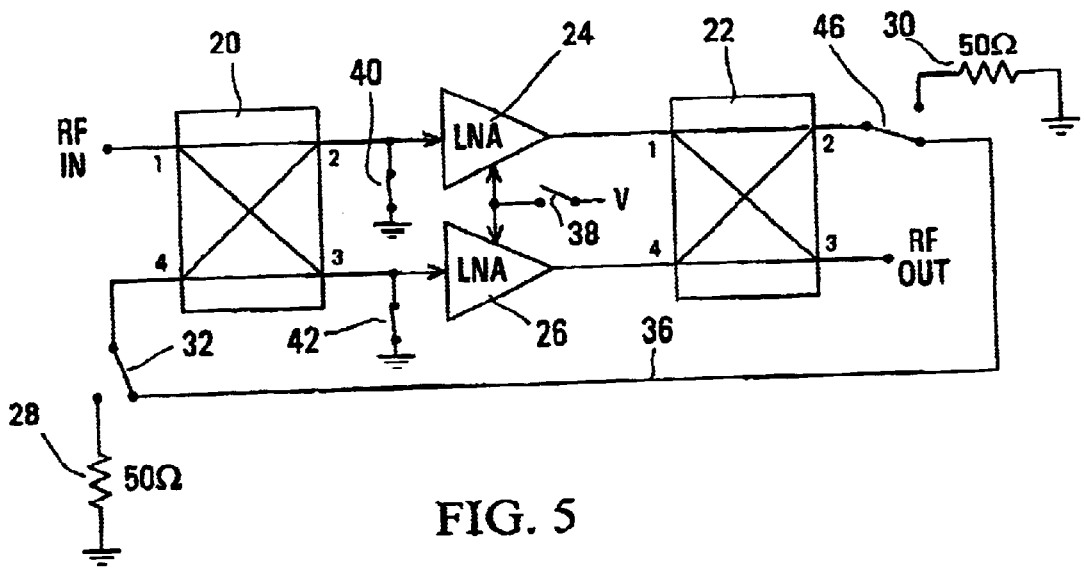
FIG. 5 schematically illustrates a balanced LNA arrangement in accordance with a further embodiment of this invention.

FIG. 5 illustrates a balanced LNA arrangement in accordance with a further embodiment of this invention, which is similar to the arrangement of FIG. 4 except that the combiner 44 is eliminated, the RF output being connected directly to port 3 of the coupler 22, and a switch 46 is provided with its pole connected to port 2 of coupler 22 for selective switching between the load 30 and the bypass path 36.

The switches in FIG. 5 are shown in their positions for bypassing the LNAs. Instead of being switched to the RF output as in the arrangement of FIG. 3, or combined via a combiner as in the arrangement of FIG. 4, in the arrangement of FIG. 5 the signal component on the bypass path 36 is supplied via the switch 46 to port 2 of the coupler 22, phase quadrature components being reflected by a mismatch at the outputs of the LNAs 24 and 26 and the reflected signal components being combined in phase with one another at port 3 of the coupler 22, and hence appearing at the RF output. Thus this arrangement of FIG. 5 makes use for the output, similarly as for the input, of properties of the couplers and mismatching at the LNAs to recombine the signal component bypassed around the LNAs.

The arrangement of each of FIGS. 3 to 5 may also include an optional attenuator (not shown) between port 4 of the coupler 20 and the switch 32, to attenuate noise generated by the switch 32 in its path to the inputs of the LNAs 24 and 26. For example, this may be a pi-attenuator formed by one series and two shunt impedances.

Although each of FIGS. 3 to 5 relates to a balanced LNA arrangement, principles of the invention can also be applied to an unbalanced LNA arrangement. One example of such an arrangement is illustrated in FIG. 6, and comprises a three-port circulator 50, a LNA 52, two-way switches 54 and 56, and a matching load 58.

Figure 6:
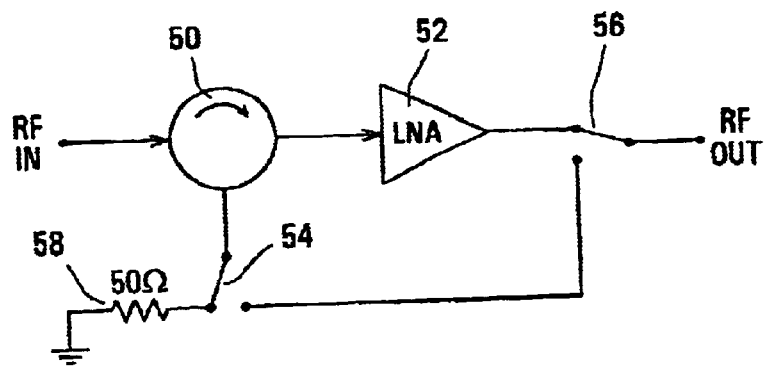
FIG. 6 schematically illustrates an LNA arrangement in accordance with yet another embodiment of this invention.

In FIG. 6, the switches 54 and 56 are shown in a position in which the LNA 56 is effective for amplifying a signal supplied to the input RF IN. Such a signal is supplied to one port of the circulator 50, and from a second port of the circulator 50 to the input of the LNA 52. The LNA amplifies the signal and supplies the amplified signal via the switch 56 to the RF output. Any signal component reflected at the input of the LNA 52 is supplied from the second port to the third port of the circulator 50, and is conducted via the switch 54 to the load 58 where it is dissipated.

Conversely, in the opposite or bypass position of the switches 54 and 56, the output of the LNA 52 and the load 58 are disconnected, and the RF output is connected via the switches to the third port of the circulator 50. An RF input signal at the first port of the circulator is conducted via the second port of the circulator to the input of the LNA 52, reflected back to the second port of the circulator and conducted to the third port of the circulator, and conducted from the third port of the circulator via the switches 54 and 56 to the RF output, thereby bypassing the LNA 52.

As in the balanced LNA arrangements described above, in the arrangement of FIG. 6 the LNA 52 can be powered down by one or more voltage supply switches (not shown in FIG. 6), and/or the input of the LNA 52 can be shunted by a switched path (not shown in FIG. 6) from this input to ground, in the bypass position of the switches 54 and 56 in order to increase mismatch at the input of the LNA 52, and thereby increase the signal level supplied to the RF output. Similarly, other substitutions (for example a signal combiner instead of the switch 56) can be made in the arrangement of FIG. 6.

It can be appreciated that the LNA switching as described above can be applied to any LNA in the receive signal path of a communications system, whether the LNA is a separate unit or is incorporated in a duplexer arrangement, so that any LNA can be selectively bypassed as may be desired.

Although embodiments of the invention are described above in the context of LNA switching in the receive path of a communications system, it can be appreciated that the invention is applicable to other types of amplifier, and to other amplifier arrangements and applications.

Thus although particular embodiments of the invention are described above in detail, it can be appreciated that these and numerous other modifications, variations, and adaptations may be made without departing from the scope of the invention as defined in the claims.

What is claimed is:

1. An amplifier arrangement comprising:
   an amplifier having an input and an output;
   a coupler having at least a first port for an input signal, a second port coupled to the input of the amplifier for supplying the input signal thereto, and a third port for a component of the input signal reflected back to the second port from the input of the amplifier;
   a switch for coupling the third port to a load in a first state of the switch and to a bypass path in a second state of the switch; and
   an output of the amplifier arrangement derived from the output of the amplifier in the first state of the switch and from the bypass path in the second state of the switch.

2. An arrangement as claimed in claim 1 and including a switch for interrupting a supply voltage of the amplifier in said second state of the first switch.

3. An arrangement as claimed in claim 1 and including a switch for shunting the input of the amplifier to ground in said second state of the first switch.

4. An arrangement as claimed in claim 1 and including a switch for interrupting a supply voltage of the amplifier in said second state of the first switch, and a switch for shunting the input of the amplifier to ground in said second state of the first switch.

5. An arrangement as claimed in claim 1 and including a switch for coupling the output of the amplifier arrangement to the output of the amplifier in said first state of the first switch and to the bypass path in said second state of the first switch.

6. An arrangement as claimed in claim 2 and including a switch for coupling the output of the amplifier arrangement to the output of the amplifier in said first state of the first switch and to the bypass path in said second state of the first switch.

7. An arrangement as claimed in claim 3 and including a switch for coupling the output of the amplifier arrangement to the output of the amplifier in said first state of the first switch and to the bypass path in said second state of the first switch.

8. An arrangement as claimed in claim 2 and including a signal combiner for coupling the output of the amplifier and the bypass path to the output of the amplifier arrangement.

9. An arrangement as claimed in claim 4 and including a signal combiner for coupling the output of the amplifier and the bypass path to the output of the amplifier arrangement.

10. An arrangement as claimed in claim 1 and further comprising:
    a second amplifier having an input and an output, the input of the second amplifier being coupled to a fourth port of the first coupler; and
    a second coupler for coupling the outputs of the amplifiers to the output of the amplifier arrangement.

11. A balanced amplifier arrangement comprising:
    two amplifiers each having an input and an output;
    a first coupler having a first port for an input signal, second and third ports coupled to the inputs of the amplifiers, and a fourth port, the coupler being such that an input signal supplied to the first port is coupled to the second port and to the third port with a relative phase difference of 90°, and components of the input signal reflected back to the first coupler from the inputs of the amplifiers cancel at the first port and add at the fourth port of the coupler;
    a second coupler for combining signals at the outputs of the amplifiers in phase with one another;
    a switch for coupling the fourth port of the first coupler to a load in a first state of the switch and to a bypass path in a second state of the switch; and
    an output of the amplifier arrangement derived from the combined outputs of the amplifiers in the first state of the switch and from the bypass path in the second state of the switch.

12. A balanced amplifier arrangement as claimed in claim 11 and including a switch for interrupting a supply voltage of the amplifiers in said second state of the first switch.

13. A balanced amplifier arrangement as claimed in claim 11 and including two switches for shunting the inputs of the amplifiers to ground in said second state of the first switch.

14. A balanced amplifier arrangement as claimed in claim 11 and including a switch for interrupting a supply voltage of the amplifiers in said second state of the first switch, and two switches for shunting the inputs of the amplifiers to ground in said second state of the first switch.

15. A balanced amplifier arrangement as claimed in claim 11 and including a switch for coupling the combined outputs of the amplifiers to the output of the amplifier arrangement in said first state of the first switch and for coupling the bypass path to the output of the amplifier arrangement in said second state of the first switch.

16. A balanced amplifier arrangement as claimed in claim 12 and including a switch for coupling the combined outputs of the amplifiers to the output of the amplifier arrangement in said first state of the first switch and for coupling the bypass path to the output of the amplifier arrangement in said second state of the first switch.

17. A balanced amplifier arrangement as claimed in claim 13 and including a switch for coupling the combined outputs of the amplifiers to the output of the amplifier arrangement in said first state of the first switch and for coupling the bypass path to the output of the amplifier arrangement in said second state of the first switch.

18. A balanced amplifier arrangement as claimed in claim 12 and including a signal combiner for coupling the combined outputs of the amplifiers and the bypass path to the output of the amplifier arrangement.

19. A balanced amplifier arrangement as claimed in claim 14 and including a signal combiner for coupling the combined outputs of the amplifiers and the bypass path to the output of the amplifier arrangement.

20. A balanced amplifier arrangement as claimed in claim 12 wherein the second coupler comprises a phase quadrature coupler having two ports coupled to the outputs of the amplifiers, a third port coupled to the output of the amplifier arrangement, and a fourth port, the arrangement further comprising a further switch for coupling the fourth port of the second coupler to a load in said first state of the first switch and to the bypass path in said second state of the first switch.

21. A balanced amplifier arrangement as claimed in claim 14 wherein the second coupler comprises a phase quadrature coupler having two ports coupled to the outputs of the amplifiers, a third port coupled to the output of the amplifier arrangement, and a fourth port, the arrangement further comprising a further switch for coupling the fourth port of the second coupler to a load in said first state of the first switch and to the bypass path in said second state of the first switch.

22. A duplexer arrangement for a communications system, the duplexer arrangement comprising an amplifier arrangement as claimed in claim 1, a transmit path for coupling a signal from an output of a transmitter to an antenna, and a receive path including a receive filter for coupling a received signal from the antenna to said first port of the coupler of the amplifier arrangement as said input signal.

23. A duplexer arrangement for a communications system, the duplexer arrangement comprising a balanced amplifier arrangement as claimed in claim 11, a transmit path for coupling a signal from an output of a transmitter to an antenna, and a receive path including a receive filter for coupling a received signal from the antenna to said first port of the first coupler of the balanced amplifier arrangement as said input signal.

24. A method of selectively bypassing an amplifier in an amplifier arrangement, comprising the steps of:

supplying a signal to an input of the amplifier;

when the amplifier is not bypassed, dissipating in a load components of the signal which are reflected at the input of the amplifier; and selecting components of the signal which are reflected at the input of the amplifier to bypass the amplifier.

25. A method as claimed in claim 24 and including the step of increasing signal reflection at the input of the amplifier when said components are selected to bypass the amplifier.

26. A method as claimed in claim 25 wherein the step of increasing signal reflection at the input of the amplifier comprises interrupting a supply voltage to the amplifier and/or shunting the input of the amplifier to ground.

\* \* \* \* \*